(12) United States Patent
Robustelli

(10) Patent No.: US 9,627,055 B1
(45) Date of Patent: Apr. 18, 2017

(54) PHASE CHANGE MEMORY DEVICES AND SYSTEMS HAVING REDUCED VOLTAGE THRESHOLD DRIFT AND ASSOCIATED METHODS

(71) Applicant: Intel Corporation, Santa Clara, CA (US)

(72) Inventor: Mattia Robustelli, Milan (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/757,831

(22) Filed: Dec. 26, 2015

(51) Int. Cl.
*G11C 13/00* (2006.01)
*G06F 13/16* (2006.01)

(52) U.S. Cl.
CPC ........ *G11C 13/004* (2013.01); *G06F 13/1657* (2013.01); *G11C 13/0004* (2013.01); *G11C 13/0069* (2013.01); *G11C 13/0097* (2013.01)

(58) Field of Classification Search
CPC .......................... G11C 11/5678; G11C 13/004
USPC ........................................................ 365/163
See application file for complete search history.

(56) References Cited

U.S. PATENT DOCUMENTS

| | | | | | |
|---|---|---|---|---|---|
| 6,768,665 | B2 * | 7/2004 | Parkinson | ........... | G11C 11/5678 365/113 |
| 7,778,079 | B2 * | 8/2010 | Jeong | ........ | G11C 8/08 365/100 |
| 7,787,278 | B2 * | 8/2010 | Bae | ......... | G11C 11/56 365/100 |
| 7,936,593 | B2 * | 5/2011 | Savransky | .............. | H01L 45/04 257/2 |
| 7,990,761 | B2 * | 8/2011 | Gordon | ..................... | G11C 8/10 365/148 |
| 8,036,013 | B2 * | 10/2011 | Lowrey | .............. | G11C 13/0004 365/148 |
| 8,605,531 | B2 * | 12/2013 | Kau | ......... | G11C 8/10 365/148 |
| 8,854,873 | B1 * | 10/2014 | Hollmer | ................. | G11C 7/106 365/148 |
| 2009/0244962 | A1 | 10/2009 | Gordon et al. | | |
| 2011/0134685 | A1 | 6/2011 | Kau et al. | | |

FOREIGN PATENT DOCUMENTS

WO   2016/160158   10/2016

OTHER PUBLICATIONS

Search Report and Written Opinion for International Patent Application PCT/US2016/063797 filed Nov. 26, 2016; dated Feb. 23, 2017; 13 pages.

* cited by examiner

*Primary Examiner* — R Lance Reidlinger
(74) *Attorney, Agent, or Firm* — Thorpe North & Western, LLP

(57) ABSTRACT

Phase change memory devices, systems, and associated methods are provided and described. Such devices, systems, and methods manage and reduce voltage threshold drift to increase read accuracy of phase change memory. A pre-read pulse can be delivered across a select device and a phase change material of a phase change memory cell to at least partially reset the voltage threshold drift of the select device while maintaining a program state of the phase change material.

23 Claims, 6 Drawing Sheets

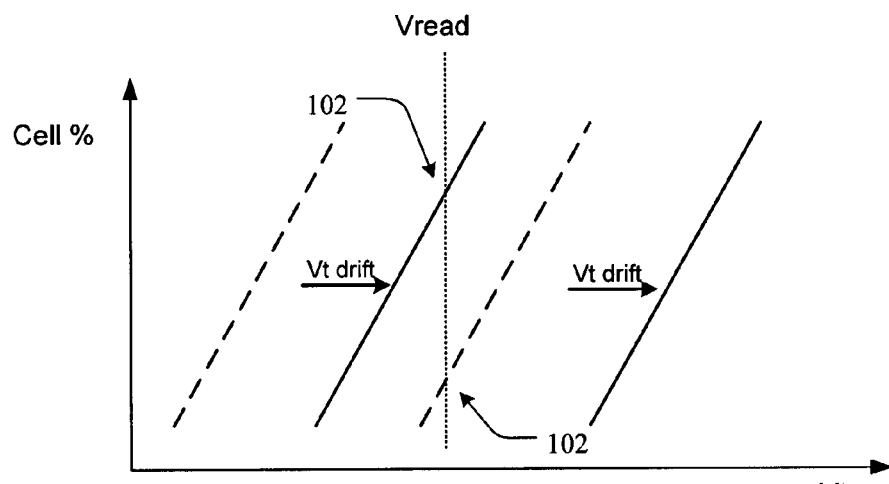
FIG. 1
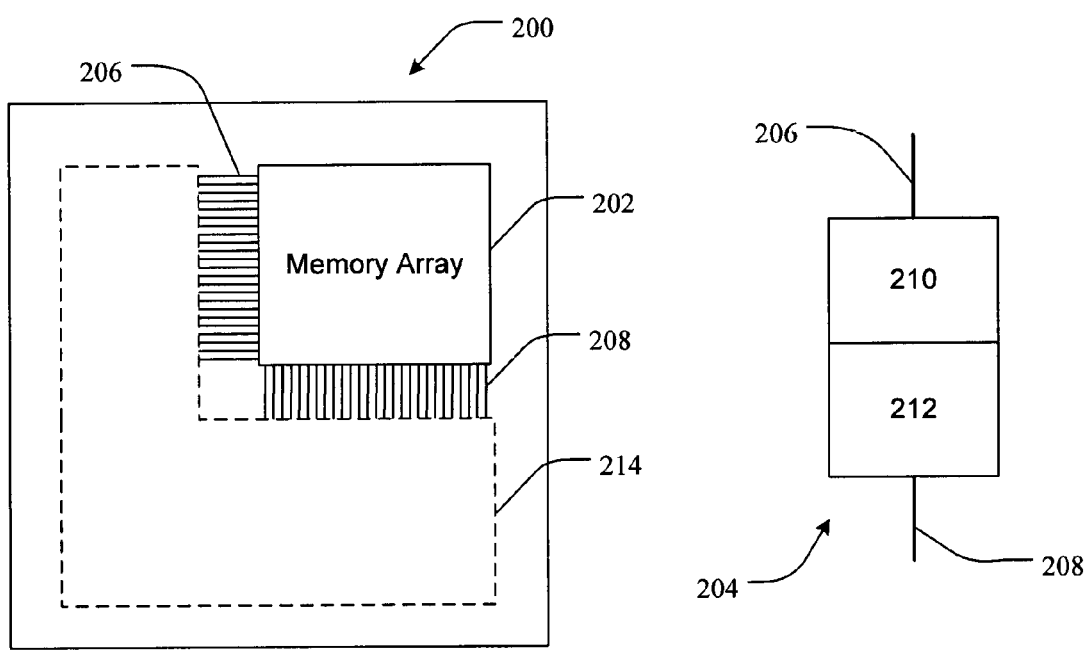
FIG. 2a
FIG. 2b

PHASE CHANGE MEMORY DEVICES AND SYSTEMS HAVING REDUCED VOLTAGE THRESHOLD DRIFT AND ASSOCIATED METHODS

BACKGROUND

Phase change materials can be used in a number of applications such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store binary information. Each state is designated a different binary value, and once stored, information can be read by detecting the electrical resistance of the material. The fact that each state persists once fixed makes PCM a valuable non-volatile memory (NVM) type.

BRIEF DESCRIPTION OF THE DRAWINGS

FIG. 1 is a graphical representation of exemplary simulated data;

FIG. 2a is a schematic top-down view of an exemplary phase change memory device;

FIG. 2b is a schematic top-down view of an exemplary phase change memory cell;

DESCRIPTION OF EMBODIMENTS

Figure 3:
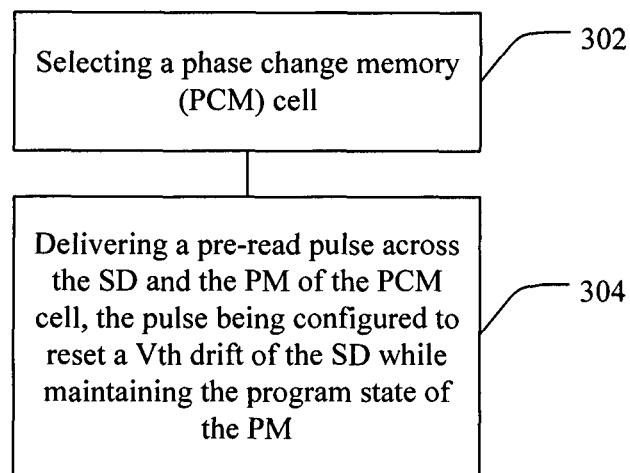
FIG. 3 is a representation of exemplary method steps.

Although the following detailed description contains many specifics for the purpose of illustration, a person of ordinary skill in the art will appreciate that many variations and alterations to the following details can be made and are considered included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies both to the form and function of individual components in a device or process, as well as to such devices or processes as a whole.

As used herein, "coupled" refers to a relationship of physical connection or attachment between one item and another item, and includes relationships of either direct or indirect connection or attachment. Any number of items can be coupled, such as materials, components, structures, layers, devices, objects, etc.

As used herein, "directly coupled" refers to a relationship of physical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

The use of phase change materials in devices such as phase change memory (PCM) cells, selectors, switches, and the like, is made possible by a phenomenon known as threshold shifting. A typical phase change material in an amorphous state has a very high electrical resistance. In order to change the material to a crystalline state, extremely high voltages would be required to deliver sufficient current to heat the material above the crystallization temperature. However, when a voltage above a threshold voltage (Vt) is applied to the amorphous material, its electrical resistance greatly decreases and the material becomes electrically conductive. Once the material is electrically conductive current can suddenly flow in (e.g. during a write or programming operation) and rapidly heat and melt the material. If the current is abruptly switched off after melting, the material will return to the amorphous state, and the original Vt will recover slowly over time. If the material is heated to a temperature between the crystallization temperature (or glass transition temperature) and the melting point temperature for that material, and then maintained for a sufficient time, the phase change material will crystallize and subsequently cool in a more conductive state.

One challenge that can arise, however, relates to the drift of Vt over time. Drift refers to the tendency of a phase change material to shift from its programmed value over time. For example, FIG. 1 shows the drift of Vt for populations of phase change materials in the crystalline or "set" phase (two lines on the left) and in the amorphous or "reset" phase (two lines on the right). In a read operation, to determine the state of a given PCM cell, for example, a read bias (Vread) is applied across the cell at a voltage that is between the reset Vt and the set Vt. By this it is determined whether the Vt of the cell is above or below the Vread, and thus whether the cell is in a set or reset state. As can be seen in FIG. 1, however, Vt drift can cause ambiguity 102 between the set and reset states, potentially resulting in read errors.

At the memory array level, Vt drift results in a shift of the memory cell distributions of set and reset cells over time. The presently disclosed subject matter provides devices, systems, and methods for managing Vt drift by partially or fully resetting the Vt of the phase change material to or toward the Vt at the time of programming. By resetting the Vt, the read ambiguity introduced through the drift process and the associated shift in population distributions of memory cells is thus reduced or eliminated. This process can also be referred to as refreshing or resetting, either partially or fully, the Vt, the drift, the drift clock, and the like. As such, "resetting" and "refreshing" can be used interchangeably, and can refer to either fully or partially resetting Vt back to or toward the Vt of the material at the time of programming (i.e. resetting the drift clock). According to one embodiment, the resetting of Vt can be achieved through the delivery of a pre-read pulse to a PCM cell (or other phase change material device) that is able to reset the Vt without programming the PCM cell, although in some cases programming may be performed as part of the operation, particularly for PCM cells in the reset state.

In one embodiment, as is shown in FIGS. 2a-b for example, a PCM memory device 200 is provided, comprising a memory array 202 that is further comprised of an array of PCM cells 204 coupled together by an array of word lines 206 and an array of bit lines 208. As is shown in FIG. 2b, a PCM cell comprises a select device (SD) 210 and a phase change material (PM) 212 coupled to the SD, where the PM has a program state. In one embodiment, the program state can be either crystalline (set) or amorphous (reset). Additionally, while a word line 206 is shown coupled to the SD 210 and a bit line 208 is shown coupled to the PM 212, in some embodiments this coupling arrangement can be switched.

The PCM memory device 200 also comprises circuitry 214 coupled to the array of PCM cells, which is generally represented by the dashed box. The circuitry 214 is generally configured to select a PCM cell 204 from the memory array 202, and to deliver a pre-read pulse to the PCM cell 204, such as, for example, across the SD 210 and the PM 212 of the PCM cell 204. The pre-read pulse is configured to at least partially reset the Vt drift of the PCM cell 204 (SD, PM, or both), while maintaining the program state of the PM 212. Various circuit designs can be utilized in this way, and any such circuit design is considered to be within the present scope.

In another embodiment, as is shown in FIG. 3, a non-limiting example of a method of managing Vt drift in a PCM memory array is shown. Such a method can include 302 selecting a PCM cell, where the PCM cell comprises a SD functionally coupled to a PM having a program state, and 304 delivering a pre-read pulse across the SD and the PM of the PCM cell, wherein the pre-read pulse is configured to at least partially reset a Vt drift of the PCM cell while maintaining the program state of the PM.

The pre-read pulse can include any current pulse having electrical characteristics such that, when applied to a PCM cell or a population of PCM cells, resets the Vt of the SD, the PM, or both, without necessarily reprogramming or disturbing the state of the PM. In one embodiment, the pre-read pulse has a voltage that is higher than the voltage bias of the read pulse (Vread). In another embodiment, the pre-read pulse has a voltage that is higher than the Vt of the PCM cell in the reset state. In yet another embodiment, the pre-read pulse has a voltage that is higher than the Vt of the PCM cell that has drifted the furthest in the population of PCM cells. In one embodiment, the pre-read pulse can reset the Vt of the PCM in the set state but have current characteristics such that the PM material does not melt or otherwise disturb.

A pre-read pulse can be applied prior to the effective read operation, for example, with a high PCM cell Vsel, in order to ensure that all PCM cells are selected regardless of how far they have drifted. In other words, when selecting a given PCM cell, the Vsel used should be sufficiently high to ensure that the Vsel is greater than the Vt of the PCM cell, no matter how far it may have drifted. Following Vt drift reset, the effective read can then be performed with the traditional Vread that has now been properly trimmed on the time-zero/fixed drift distribution.

Figure 4:
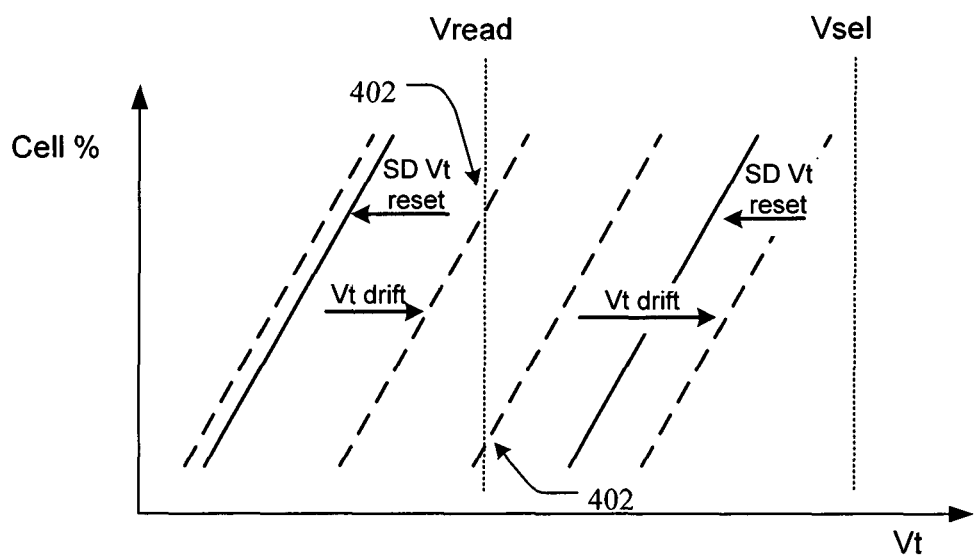
FIG. 4 is a graphical representation of exemplary simulated data.

FIG. 4 shows an example of the drift of Vt for the SD material in populations of PCM cells in the crystalline or "set" phase (two lines on the left) and in the amorphous or "reset" phase (two lines on the right), followed by a Vt reset of the SD material back toward the original value of Vt. The Vsel represents the bias applied to select the cell, which is shown at a voltage that is greater than the Vt of the furthest drifted PCM cell in the reset state. In a read operation to determine the state of a given PCM cell, Vread is applied across the cell at a voltage that is between the reset Vt and the set Vt. The solid line on the left representing the now reset SD Vt of the population of PCM cells in the set state has been shifted to the left and away from the previously ambiguous point 402. One other useful effect of delivering such a pre-read pulse is the refreshing of the margin of E4 (rightmost edge of reset distribution) vs. the maximum selection voltage whenever the cell is read. In other words, over time the Vt margin of the reset cell distribution can drift to higher values, thus necessitating a higher value of Vsel to be applied in order ensure that a given PCM cell snaps in response. Delivering a pre-read pulse to cells of the distribution as they are read thus lowers or refreshes the margin of the cell distribution.

It is noted that, while the pre-read pulse can be delivered or otherwise applied to the PCM cell independent of the read operation, the pre-read pulse can also be linked to, or even be an embedded component of the read operation. Thus, the generation, timing, and delivery of the pre-read pulse can be part of the circuitry, commands from the memory controller, a dedicated processor, or the like. Additionally, the pre-read pulse can be delivered by the same or different mechanisms for each of the set and reset distributions.

In one embodiment, the pre-read pulse can reset the SD Vt drift on set state cells, while it re-programs reset state cells. Note that re-programming results in the resetting of the Vt drift for both the SD and the PM of the PCM cells. Unlike the partial Vt reset for the distribution of cells in the reset state shown in FIG. 4, the reset cell distribution of FIG. 5 (lines on the right) has been reset to a state that is much closer to the original values of Vt, or in other words, is a more complete Vt reset.

Figure 6A:
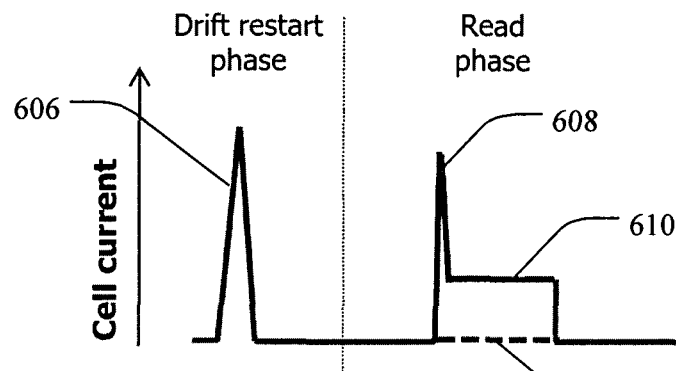
FIG. 6a is a graphical representation of exemplary simulated data.
Figure 6B:
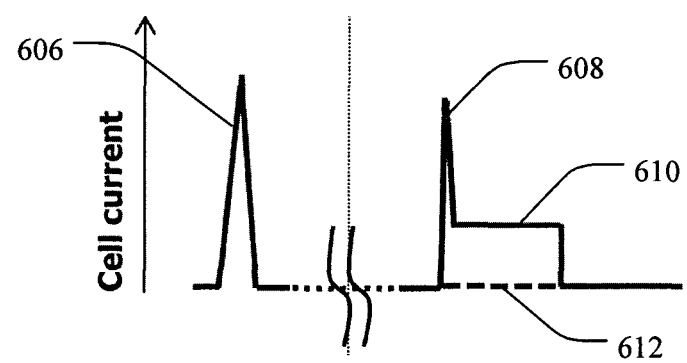
FIG. 6b is a graphical representation of exemplary simulated data.
Figure 6C:
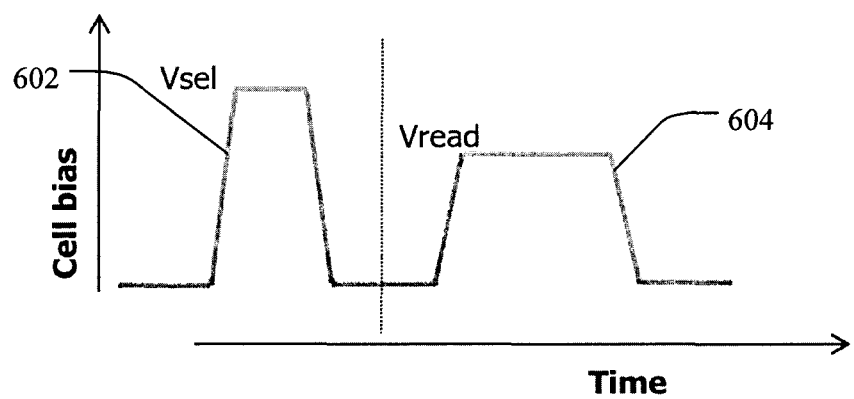
FIG. 6c is a graphical representation of exemplary simulated data.

FIGS. 6a-c show embodiments of pre-read pulses 602, read pulses 604, and resulting simulated responses in PCM cells to such pulses. FIG. 6c shows examples of PCM cell bias due to the pre-read pulse 602 and the read pulse 604, and simulated current responses in a PCM cell as a result of the respective pulses. In some embodiments, as has been described, the pre-read pulse can be embedded in the read sequence, responses to which are shown in FIG. 6a. In other embodiments, the pre-read pulse can be independent of the read sequence, responses to which are shown in FIG. 6b, and represented by the broken line between the two phases. In some cases, the pre-read pulse can be independent of the read sequence and in a dedicated operation prior to the read pulse. Generally, in a Vt drift restart or reset phase, it can be beneficial for the Vsel to be sufficiently high to facilitate cell selection independently of the state/drift induced state of the PCM cell. As is shown in FIGS. 6a-b, all PCM cells, regardless of set or reset state, generate a snap-back current response 606 because the Vsel has a higher voltage bias than the Vt for all of the PCM cells.

In the read phase, the Vread 604, which can be the trimmed or "trim-by-die" value, has a voltage bias that is between the Vt of the set PCM cell distribution and the Vt of the reset PCM cell distribution. As a result, PCM cells of the set distribution will generate a snap-back current 608 to Vread 604 and will hold 610 for the duration of the cell bias (i.e. a read clamp). The PCM cells of the reset distribution, however, will not generate a snap-back current, and will remain unresponsive 612 to Vread 604 due to the higher Vt of the reset cells. It is noted that the PCM cells should be unselected, or turned off, between the drift restart phase and the read phase to ensure that the cell bias from Vsel does not affect the read operation.

Figure 5:
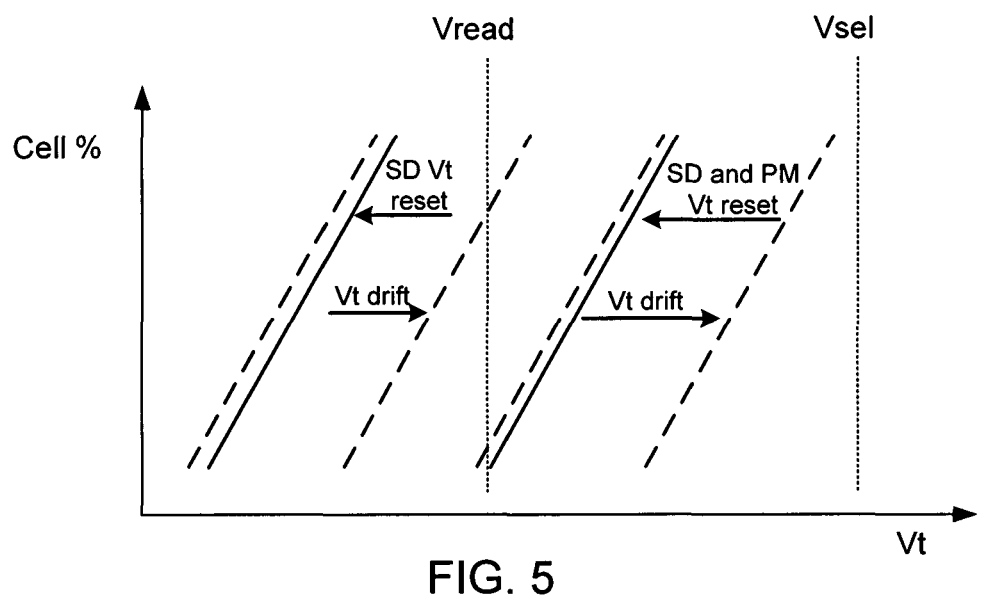
FIG. 5 is a graphical representation of exemplary simulated data.

Returning to FIG. 5, it is therefore possible that reading a cell in a reset state can re-program the PM of the PCM cell. While such a process can be independent of the read operation, in one embodiment the snap-back current spike induced by Vsel of the pre-read pulse can be used for re-programming. Thus, the snap-back current can be applied to or maintained in the PCM cell, whereby at least the PM layer melts and re-programs again as a reset cell with an amorphous lattice structure. As a result of re-programming, the Vt drift for both the SD and PM are reset, as is shown in FIG. 5.

Figure 7:
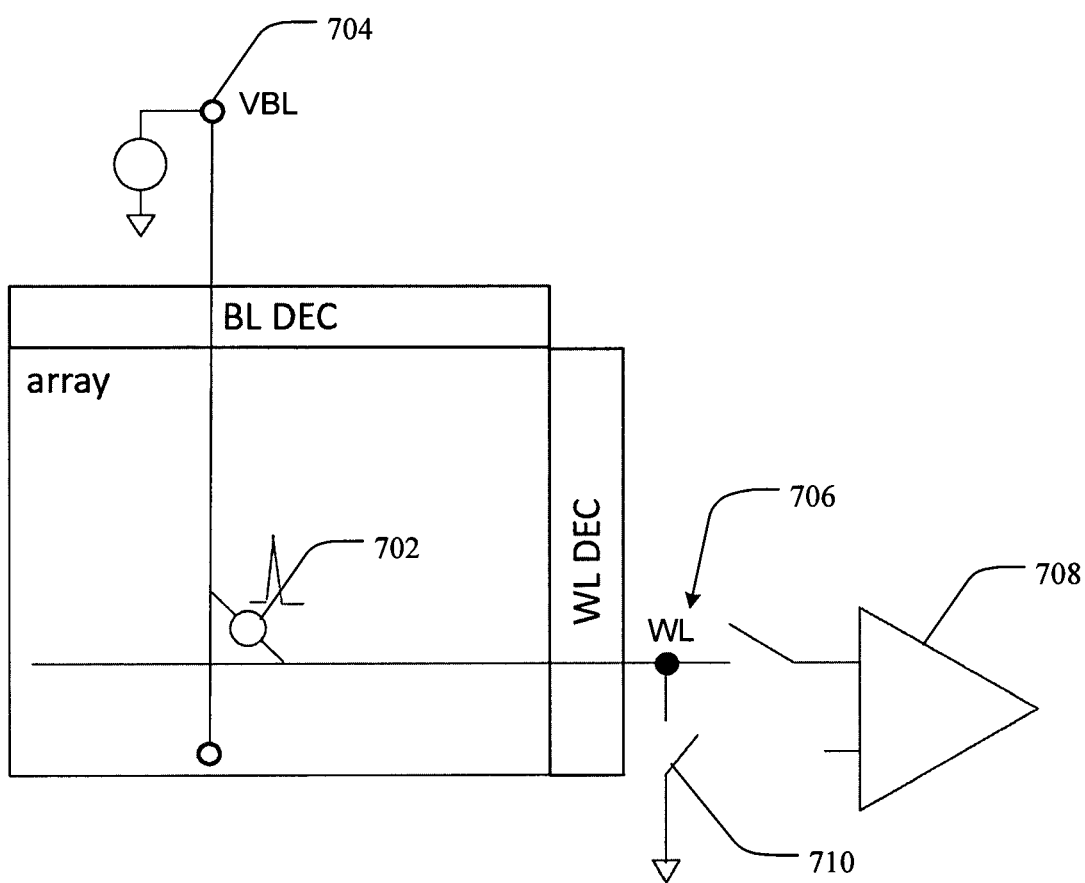
FIG. 7 is an exemplary circuit diagram.

One possible non-limiting implementation can be the snap-back current spike obtained through a Full-Float-Read (FFR) operation. FIG. 7 shows one embodiment of an example circuit implementation capable of using the snap-back current from a FFR operation as a pre-read pulse. The circuit, which shows a single PCM cell of a memory array, comprises a PCM cell 702 coupled to a bit line bias (VBL) 704 and to a word line (WL) node (706). A switching amplifier 708 is switchably coupled to the WL node 706. A charging switch 710 switchably couples the WL node 706 to a low voltage. In response to a read operation, the WL node 706 is charged by closing the charging switch 710 with the amplifier 708 coupled to the WL node. The charging switch 710 is then opened and the amplifier 708 is disconnected from the WL node 706. The bit line side of the circuit is charged to VBL, such that Vsel is the difference between VBL and the WL node bias. The PCM cell 702 snaps at the SD as a result, and the WL node is charged, leading to a decrease in Vsel due to the VBL-VWL (word line bias), and the PCM cell 702 shuts off. The snap-back current has thus been used in the PCM cell 702 as a pre-read pulse, and, if in the reset state, the PM of the PCM cell is re-programmed and the drift of SD and PM is reset. If the cell was in the set state, the Vt of the SD is reset without reprogramming the PM.

Figure 8:
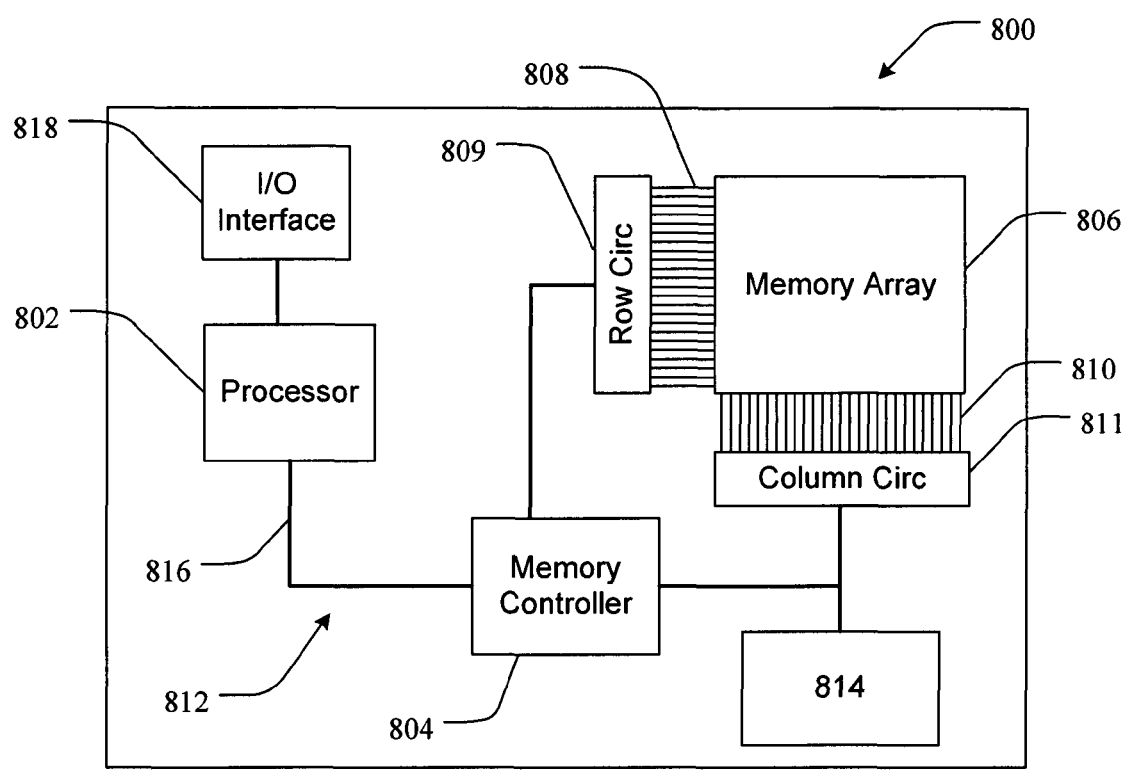
FIG. 8 is a schematic view of an exemplary phase change memory system.

In another embodiment, a computing system is provided, as is shown in FIG. 8. Such a system 800 can include a processor 802, a memory controller 804 coupled to the processor 802, and a memory array 806 of PCM cells. Each PCM cell 204, as is shown in FIG. 2b, can comprise a SD 210 and a PM 212 having a program state and coupled to the SD. The system further comprises a plurality of metallization word lines 808 coupled to groups of PCM cells across the memory array 806 and to the memory controller 804, and a plurality of metallization bit lines 810 coupled to groups of PCM cells across the memory array 806 and to the memory controller 804. Each PCM cell 204 is thus uniquely addressed in the memory array 806 by a combination of word lines 808 and bit lines 810. Row circuitry 809 and column circuitry 811 can be coupled to the word lines 808 and the bit lines 811, respectively. The system also comprises circuitry 812 coupled to the memory array 806, which can be configured to accomplish a variety of tasks, depending on the design of the system. Additionally, it is understood that the description of "the circuitry" can include reference to structures, tasks, processes, etc., that may be elements or functions performed by elements also recited separately in the system, such as the processor, the memory controller, and the like. As such, it is not necessarily intended that a specific distinction be drawn between the circuitry and such elements or functionality.

As one example, circuitry can be configured to select a PCM cell and deliver a pre-read pulse across the SD and the PM of the PCM cell, where the pre-read pulse is configured to at least partially reset the Vt drift of the SD, PM, or both, while maintaining the program state of the PM of the PCM cell. In such cases, the memory controller would be included in the term "circuitry" due to the role of the controller in selecting a PCM cell. Furthermore, in some embodiments, the memory controller can be integrated into the processor as an integrated controller, and thus the processor may also be considered to be a component of the circuitry.

Regarding the system as a whole, while any type or configuration of device or computing system is contemplated to be within the present scope, non-limiting examples can include laptop computers, CPU systems, SoC systems, server systems, networking systems, storage systems, high capacity memory systems, or any other computational system that can benefit from PCM memory.

Returning to FIG. 8, the system 800 can also include additional memory 814 that can include any device, combination of devices, circuitry, and the like that is capable of storing, accessing, organizing and/or retrieving data. Non-limiting examples include SANs (Storage Area Network), cloud storage networks, volatile or non-volatile RAM, another PCM array, optical media, hard-drive type media, and the like, including combinations thereof. The system can additionally include a local communication interface 816 for connectivity between the various components of the system. For example, the local communication interface 816 can be a local data bus and/or any related address or control busses as may be desired.

The system can also include an I/O (input/output) interface 818 for controlling the I/O functions of the system, as well as for I/O connectivity to devices outside of the system. A network interface can also be included for network connectivity, either as a separate interface or as part of the I/O interface 818. The network interface can control network communications both within the system and outside of the system. The network interface can include a wired interface, a wireless interface, a Bluetooth interface, optical interface, and the like, including appropriate combinations thereof. Furthermore, the system can additionally include a user interface, a display device, as well as various other components that would be beneficial for such a system.

The processor 802 can be a single or multiple processors, and the memory array 806 and the additional memory 814 can be a single or multiple memories. The local communication interface 816 can be used as a pathway to facilitate communication between any of a single processor, multiple processors, a single memory, multiple memories, the various interfaces, and the like, in any useful combination.

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In addition to, or alternatively to, volatile memory present in the system, in one embodiment, reference to memory devices can refer to a nonvolatile memory device whose state is determinate even if power is interrupted to the device (for example, the present PCM cell array). In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory device. In one embodiment, the memory device can be or include multi-threshold level NAND flash memory, NOR flash memory, single or multi-level PCM, a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Examples

The following examples pertain to specific embodiments and point out specific features, elements, or steps that can be used or otherwise combined in achieving such embodiments.

In one example there is provided, a phase change memory device, comprising:

an array of phase change memory (PCM) cells coupled together by an array of word lines and an array of bit lines, each PCM cell further comprising:
 a select device (SD);
 a phase change material (PM) coupled to the SD, the PM having a program state; and
 circuitry coupled to the array of PCM cells, the circuitry configured to:
select a PCM cell; and
 deliver a pre-read pulse across the SD and the PM of the PCM cell, wherein the pre-read pulse is configured to at least partially reset a threshold voltage (Vt) drift of the SD while maintaining the program state of the PM.

In one example, of a phase change memory device, the pre-read pulse voltage is higher than a Vt of the SD in a reset state.

In one example, of a phase change memory device, the circuitry is further configured perform a read operation, wherein to perform a read operation, the circuitry is to deliver a read pulse to the PCM cell to determine the program state of the PM.

In one example, of a phase change memory device, the pre-read pulse voltage is higher than a voltage of the read pulse.

In one example, of a phase change memory device, the circuitry is further configured to deliver the pre-read pulse as an embedded component of the read operation.

In one example, of a phase change memory device, wherein the circuitry is further configured to deliver the pre-read pulse separate from the read operation.

In one example, of a phase change memory device, in maintaining the program state of the PM, the circuitry is further configured to reprogram the PM to the same program state using the pre-read pulse.

In one example, of a phase change memory device, the program state is a reset state.

In one example, of a phase change memory device, the pre-read pulse comprises a snap-back current.

In one example, of a phase change memory device, the snap-back current is from the SD as a result of selecting the PCM cell.

In one example, of a phase change memory device, maintaining the program state of the PM further comprises maintaining the program state without reprogramming the PM.

In one example there is provided, a method of managing threshold voltage (Vt) drift in a phase change memory (PCM) cell, comprising:

selecting a PCM cell, the PCM cell comprising a select device (SD) functionally coupled to a phase change material (PM) having a program state; and delivering a pre-read pulse across the SD and the PM of the PCM cell, wherein the pre-read pulse is configured to at least partially reset a Vt drift of the SD while maintaining the program state of the PM.

In one example of a method of managing a Vt drift, the pre-read pulse voltage is higher than a Vt of the SD in a reset state.

In one example of a method of managing a Vt drift, the method further comprises performing a read operation comprising delivering a read pulse to the PCM cell to determine the program state of the PM.

In one example of a method of managing a Vt drift, the pre-read pulse voltage is higher than a voltage of the read pulse.

In one example of a method of managing a Vt drift, the delivery of the pre-read pulse is embedded in the read operation.

In one example of a method of managing a Vt drift, the delivery of the pre-read pulse is independent of the read operation.

In one example of a method of managing a Vt drift, maintaining the program state of the PM further comprises reprogramming the PM to the same program state using the pre-read pulse.

In one example of a method of managing a Vt drift, the program state is a reset state.

In one example of a method of managing a Vt drift, the pre-read pulse comprises a snap-back current.

In one example of a method of managing a Vt drift, the snap-back current is from the SD as a result of selecting the PCM cell.

In one example of a method of managing a Vt drift, maintaining the program state of the PM further comprises maintaining the program state without reprogramming the PM.

In one example there is provided, a computing system, comprising:
 a processor;
 a memory controller coupled to the processor;
 a memory array of PCM cells each having:
 a select device (SD); and
 a phase change material (PM) having a program state and coupled to the SD;
 a plurality of metallization word lines coupled to groups of PCM cells across the PCM cell array and to the memory controller;
 a plurality of metallization bit lines coupled to groups of PCM cells across the PCM cell array and to the memory controller, wherein each PCM cell is uniquely addressed in the PCM cell array by a combination of word lines and bit lines; and
   circuitry coupled to the memory array and configured to:
   select a PCM cell; and
   deliver a pre-read pulse across the SD and the PM of the PCM cell, wherein the pre-read pulse is configured to at least partially reset a threshold voltage (Vt) drift of the SD while maintaining the program state of the PM.

In one example of a computing system, the pre-read pulse voltage is higher than a Vt of the SD in a reset state.

In one example of a computing system, the circuitry is further configured perform a read operation, wherein to perform a read operation, the circuitry is to deliver a read pulse to the PCM cell to determine the program state of the PM.

In one example of a computing system, the pre-read pulse voltage is higher than a voltage of the read pulse.

In one example of a computing system, the circuitry is further configured to deliver the pre-read pulse as an embedded component of the read operation.

In one example of a computing system, the circuitry is further configured to deliver the pre-read pulse independently of the read operation.

In one example of a computing system, in maintaining the program state of the PM, the circuitry is further configured to reprogram the PM to the same program state using the pre-read pulse.

In one example of a computing system, the program state is a reset state.

In one example of a computing system, the pre-read pulse comprises a snap-back current.

In one example of a computing system, the snap-back current is from the SD as a result of selecting the PCM cell.

In one example of a computing system, maintaining the program state of the PM further comprises maintaining the program state without reprogramming the PM.

In one example of a computing system, the memory controller is integrated into the processor.

In one example of a computing system, the system further comprises one or more of:

a network interface communicatively coupled to at least one of the at least one processor;

a battery coupled to at least one of the at least one processor; or a display communicatively coupled to at least one of the at least one processor.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A phase change memory device, comprising:
an array of phase change memory (PCM) cells coupled together by an array of word lines and an array of bit lines, each PCM cell further comprising:
a select device (SD);
a phase change material (PM) coupled to the SD, the PM having a program state; and
circuitry coupled to the array of PCM cells, the circuitry configured to:
select a PCM cell; and
deliver a pre-read pulse across the SD and the PM of the PCM cell, wherein the pre-read pulse is configured to at least partially reset a threshold voltage (Vt) drift of the SD while maintaining the program state of the PM.

2. The device of claim 1, wherein the pre-read pulse voltage is higher than a Vt of the SD in a reset state.

3. The device of claim 1, wherein the circuitry is further configured to perform a read operation, wherein to perform a read operation, the circuitry is to deliver a read pulse to the PCM cell to determine the program state of the PM.

4. The device of claim 3, wherein the pre-read pulse voltage is higher than a voltage of the read pulse.

5. The device of claim 3, wherein the circuitry is further configured to deliver the pre-read pulse as an embedded component of the read operation.

6. The device of claim 3, wherein the circuitry is further configured to deliver the pre-read pulse separate from the read operation.

7. The device of claim 1, wherein, in maintaining the program state of the PM, the circuitry is further configured to reprogram the PM to the same program state using the pre-read pulse.

8. The device of claim 7, wherein the program state is a reset state.

9. The device of claim 7, wherein the pre-read pulse comprises a snap-back current.

10. The device of claim 9, wherein the snap-back current is from the SD as a result of selecting the PCM cell.

11. The device of claim 1, wherein maintaining the program state of the PM further comprises maintaining the program state without reprogramming the PM.

12. A method of managing threshold voltage (Vt) drift in a phase change memory (PCM) cell, comprising:
selecting a PCM cell, the PCM cell comprising a select device (SD) functionally coupled to a phase change material (PM) having a program state; and
delivering a pre-read pulse across the SD and the PM of the PCM cell, wherein the pre-read pulse is configured to at least partially reset a Vt drift of the SD while maintaining the program state of the PM.

13. The method of claim 12, wherein the pre-read pulse voltage is higher than a Vt of the SD in a reset state.

14. The method of claim 12, further comprising performing a read operation comprising delivering a read pulse to the PCM cell to determine the program state of the PM.

15. The method of claim 12, wherein maintaining the program state of the PM further comprises reprogramming the PM to the same program state using the pre-read pulse.

16. The method of claim 12, wherein maintaining the program state of the PM further comprises maintaining the program state without reprogramming the PM.

17. A computing system, comprising:
at least one processor;
a memory controller coupled to the processor;
a memory array of phase change memory (PCM) cells each having:
a select device (SD); and
a phase change material (PM) having a program state and coupled to the SD;
a plurality of metallization word lines coupled to groups of PCM cells across the PCM cell array and to the memory controller;
a plurality of metallization bit lines coupled to groups of PCM cells across the PCM cell array and to the memory controller, wherein each PCM cell is uniquely addressed in the PCM cell array by a combination of word lines and bit lines; and
circuitry coupled to the memory array and configured to:
select a PCM cell; and
deliver a pre-read pulse across the SD and the PM of the PCM cell, wherein the pre-read pulse is configured to at least partially reset a threshold voltage (Vt) drift of the SD while maintaining the program state of the PM.

18. The system of claim 17, wherein the pre-read pulse voltage is higher than a Vt of the SD in a reset state.

19. The system of claim 17, wherein the circuitry is further configured to perform a read operation, wherein to perform a read operation, the circuitry is to deliver a read pulse to the PCM cell to determine the program state of the PM.

20. The system of claim 17, wherein, in maintaining the program state of the PM, the circuitry is further configured to reprogram the PM to the same program state using the pre-read pulse.

21. The system of claim 17, wherein maintaining the program state of the PM further comprises maintaining the program state without reprogramming the PM.

22. The system of claim 17, wherein the memory controller is integrated into the processor.

23. The system of claim 17, further comprising one or more of:
- a network interface communicatively coupled to at least one of the at least one processor;
- a battery coupled to at least one of the at least one processor; or
- a display communicatively coupled to at least one of the at least one processor.

* * * * *